(12) United States Patent
Shenoy et al.

(10) Patent No.: US 6,378,114 B1
(45) Date of Patent: *Apr. 23, 2002

(54) METHOD FOR THE PHYSICAL PLACEMENT OF AN INTEGRATED CIRCUIT ADAPTIVE TO NETLIST CHANGES

(75) Inventors: Narendra V. Shenoy, Sunnyvale; Lukas Van Ginneken, San Jose, both of CA (US)

(73) Assignee: Synopsys, Inc., Mountain View, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/886,625

(22) Filed: Jul. 1, 1997

(51) Int. Cl.[7] .............................................. G06F 17/50
(52) U.S. Cl. ............................................. 716/7; 716/8
(58) Field of Search ...................... 395/500.08, 500.09, 395/500.1, 500.19; 716/7, 8, 1, 2, 9, 10, 11

(56) References Cited

U.S. PATENT DOCUMENTS

| | | | | |
|---|---|---|---|---|
| 4,495,559 A | * | 1/1985 | Gelatt, Jr. et al. | 364/148 |
| 4,577,276 A | * | 3/1986 | Dunlop et al. | 364/491 |
| 4,918,614 A | * | 4/1990 | Modarres et al. | 364/490 |
| 5,267,176 A | * | 11/1993 | Antreich et al. | 364/491 |
| 5,532,934 A | * | 7/1996 | Rostoker | 364/488 |
| 5,629,860 A | * | 5/1997 | Jones et al. | 364/490 |
| 5,757,657 A | * | 5/1998 | Hathaway et al. | 364/491 |
| 5,818,729 A | * | 10/1998 | Wang et al. | 716/9 |
| 5,847,965 A | * | 12/1998 | Cheng | 364/488 |
| 6,086,625 A | * | 7/2000 | Shouen | 716/1 |

OTHER PUBLICATIONS

Hojat et al.; "An Integrated Placement and Synthesis Approach for Timing Closure of Power PC Microprocessors"; 1997; International Conference on Computers and Processors; Austin, Texas, pp. 206–210.

Murofushi et al.; "Layout Driven Re–Synthesis for Low Power Consumption LSD's"; 1997; Semiconductor DA & Test Engineering Center DA Development Dept., Kawasaki 210, Japan, pp. i–iv.

Kannan et al.; "A Methodology and Algorithms for Post–Placement Delay Optimization"; 1994; Cadence Design Systems, Inc., 2655 Seely Road, San Jose, CA 95134; 31st ACM/IEEE Design Automation Conference, pp. 326–332.

Stenz et al.; "Timing Driven Placement in Interaction with Netlist Transformations"; 1997; Siemens AG Semiconductor Group 81617 Munich, Germany, pp. 36–41.

Larry Stockmeyer; "Optimal Orientations of Cells in Slicing Floorplan Designs"; 1983; Computer Science Department, IBM Research Laboratory, San Jose, CA 95193, pp. 91–101.

* cited by examiner

*Primary Examiner*—Matthew Smith
*Assistant Examiner*—Leigh Marie Garbowski
(74) *Attorney, Agent, or Firm*—Wagner Murabito & Hao LLP

(57) ABSTRACT

In the design of integrated circuits, a computer controlled method for the rough placement of cells. Initially, a synthesis tool is used to generate a netlist according to HDL, user constraint, and technology data. Thereupon, a cell separation process assigns (x,y) locations to each of the cells. The cell location information is supplied to the synthesis tool, which can then make changes to the netlist thereto. In the present invention, the size of the placement area is allowed be scaled according to the new netlist. Next, the cells are spaced apart according to a spacing algorithm. A partitioning algorithm is then applied to group the cells into a plurality of partitions. A number of iterations of cell separation, synthesis of new netlist, size adjustment (if necessary), spacing, and partitioning are performed until the cells converge. Thereupon, detailed placement and routing processes are used to complete the layout.

15 Claims, 4 Drawing Sheets

METHOD FOR THE PHYSICAL PLACEMENT OF AN INTEGRATED CIRCUIT ADAPTIVE TO NETLIST CHANGES

FIELD OF THE INVENTION

The present invention relates to a method for the physical placement of an integrated circuit chip that is adaptive to changes made to a netlist.

BACKGROUND OF THE INVENTION

A highly specialized field, commonly referred to as "electronic design automation" (EDA), has evolved to handle the demanding and complicated task of designing semiconductor chips. In EDA, computers are extensively used to automate the design process. Computers are ideally suited to performing tasks associated with the design process because computers can be programmed to reduce or decompose large, complicated circuits into a multitude of much simpler functions. Thereupon, the computers can be programmed to iteratively solve these much simpler functions. Indeed, it has now come to the point where the design process has become so overwhelming that the next generation of integrated circuit (IC) chips cannot be designed without the help of computer-aided design (CAD) systems.

Typically, the design process begins with an engineer conceiving and defining the performance specification of the new IC chip. A high level language is used to translate this specification into functional criteria which are fed into a logic synthesis program. Based thereon, the synthesis program generates a netlist containing a collection of gates in terms of a particular semiconductor technology (e.g., very large scale integration—VLSI). This netlist can be regarded as a template for the realization of the physical embodiment of the integrated circuit in terms of transistors, routing resources, etc. Next, a physical design tool is used to place and route the IC chip. It determines the physical pinouts, wiring, interconnections and specific layout of the semiconductor chip. Once the physical layout is complete, the IC chip can be fabricated.

In the past, when semiconductor chips were simpler and less complex, the design process was relatively straightforward. However, advances in semiconductor technology have led the way towards more versatile, powerful, and faster integrated circuit (IC) chips. The trend is towards even larger, more complex and sophisticated IC chips in an effort to meet and improve upon the demands imposed by state-of-the-art performance. Today, a single IC chip can contain upwards of millions of transistors. As the complexity, functionalities, speed, and size of these chips increase, it is becoming a much more critical and difficult task to properly design, layout, and test the next generation of chips.

Often, several iterations of the design, layout, and testing process are required in order to optimize the semiconductor chip's size, cost, heat output, speed, power consumption, and electrical functionalities. However, one problem is attributable to the fact that each of these stages is highly dependent on the results of the other stages. A minor alteration in one stage intended to enhance one characteristic may cause unforeseen problems to occur in other stages. For example, changing a cell in the synthesis stage might drastically alter the current place and route. It is this high degree of interdependence which makes it extremely difficult to predict and account for the consequences associated with any changes. Indeed, the overall design might sometimes be worse in a successive iteration. Furthermore, the iterative process is time-consuming and requires a powerful computer to perform the processing. In addition, the iterative process is labor intensive and requires the dedication of a highly skilled, experienced EDA specialist.

Thus, there is a need for some scheme which cuts the cost and time associated with the semiconductor chip design process, while at the same time, allows a designer to optimize the chip's performance. The present invention provides one such a solution.

SUMMARY OF THE INVENTION

The present invention pertains to a computer controlled method for the rough placement of cells in the design of integrated circuits. Initially, a synthesis tool is used to generate a netlist according to HDL, user constraint, and technology data. Thereupon, a cell separation process assigns (x,y) locations to each of the cells. The cell location information is supplied to the synthesis tool, which can then make changes to the netlist thereto. In the present invention, the size of the placement area is allowed to be scaled according to the new netlist. Next, the cells of the netlist are spaced apart according to a spacing algorithm. A partitioning algorithm is then applied to group the cells into a plurality of partitions. A number of iterations of cell separation, synthesis of new netlist, size adjustment (if necessary), spacing, and partitioning are performed until the cells converge. Thereupon, detailed placement and routing processes are used to complete the layout.

BRIEF DESCRIPTION OF THE DRAWINGS

The operation of this invention can be best visualized by reference to the drawings.

DETAILED DESCRIPTION

A method for the physical placement of an IC chip which is adaptive to changes in the netlist is described. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

Figure 1:
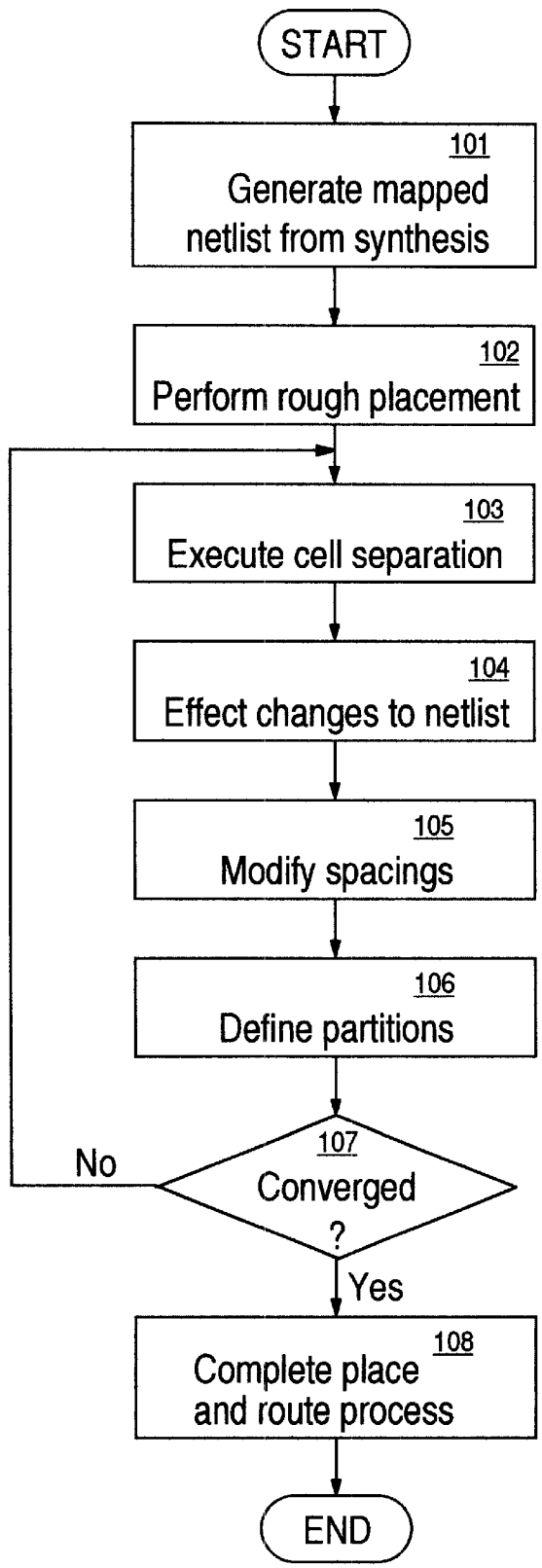
FIG. 1 is a flowchart describing the steps for performing the rough placement process whereby changes to the netlist are taken into account.

FIG. 1 is a flowchart describing the steps for performing the rough placement process whereby changes to the netlist are taken into account. Initially, a synthesis tool is used to generate a mapped netlist, step 101. For each gate in a "mapped" netlist, there exists a corresponding gate defined in the synthesis library. It should be noted that there exist many different types of synthesis tools which can be used to perform step 101. For instance, any of the synthesis tools commercially available from Synopsys, Cadence, and other EDA software manufacturers, can be used to generate the mapped netlist. (See S. Devadas et al., "Logic Synthesis," McGraw Hill Series on Computer Engineering, 1994; R. Brayton et al., "MIS: A Multiple-Level Logic Optimization System," IEEE Transactions on Computer Aided Design of Integrated Circuits, pp. 1062–1081, 1987). Based on this mapped netlist, a rough placement process is initiated in step 102. Although the present invention can be applied to any one of several phases associated with the physical route and placement of an IC design (e.g., rough placer, detailed placer, global router, and detailed router), the currently preferred embodiment is to implement the present invention in the rough placement process.

The next five steps 103–107 are performed during the rough placement process. In step 103, cell separation is executed. The cell separation process takes each cell in the netlist and assigns a pair of (x,y) coordinates. These coordinates are used to specify the location of each cell relative to a two-dimensional boundary area in which the circuit is to be placed. Next, changes to the netlist are allowed to occur, step 104. For example, current cells can be modified (e.g., gates can be sized up or down; inverters can be added or deleted; new buffers can be added or deleted, etc.), new cells can be added, old cells can be deleted, current nets can be modified, new nets can be added, and old nets can be deleted. In the present invention, these changes are primarily instigated in response to how the cells are placed. With submicron technology, it is rather difficult to accurately perform the initial synthesis because it is not known where the cells will ultimately be placed. Hence, a best estimate guess is used to perform the synthesis. Now, after cell separation is performed, the netlist is tweaked to optimize the design. For example, buffers may be added to increase the speed of a critical path. Inserting these buffers may cause the area to increase. In the past, the area in which the IC is to be placed was typically held constant. In contrast, the present invention allows the area to change in size (i.e., either grow or shrink). Should the area grow to exceed a pre-defined allocation, the present invention will automatically generate a message to indicate this condition to the user. The next step 105 involves changing the spacings. The spacings of the circuit placement is allowed to change in response to certain design criteria, such as minimization of cell density, thermal dissipation, power consumption, noise and crosstalk susceptibility, clock routes, critical paths, etc. Furthermore, the spacings can change if the routing area had changed. Thereupon, in step 106, the partitions are defined. Partitioning refers to the process of subdividing the cells in order to better "spread" them apart. A cell (e.g., in the shape of a rectangle) is broken into two roughly equal sizes by drawing either a horizontal or vertical line through the approximate midpoint. In step 107, a determination is made as to whether the current placement has successfully converged. Convergence is achieved when each of the partitions reaches a pre-determined size. For example, the user can set the convergence point to occur whenever each of the partitions is comprised of less than twenty gates. If convergence has not been reached, steps 103–106 are repeated. Otherwise, once convergence has been achieved, the detailed placement and route process is performed to complete the physical layout, step 108.

Figure 2:
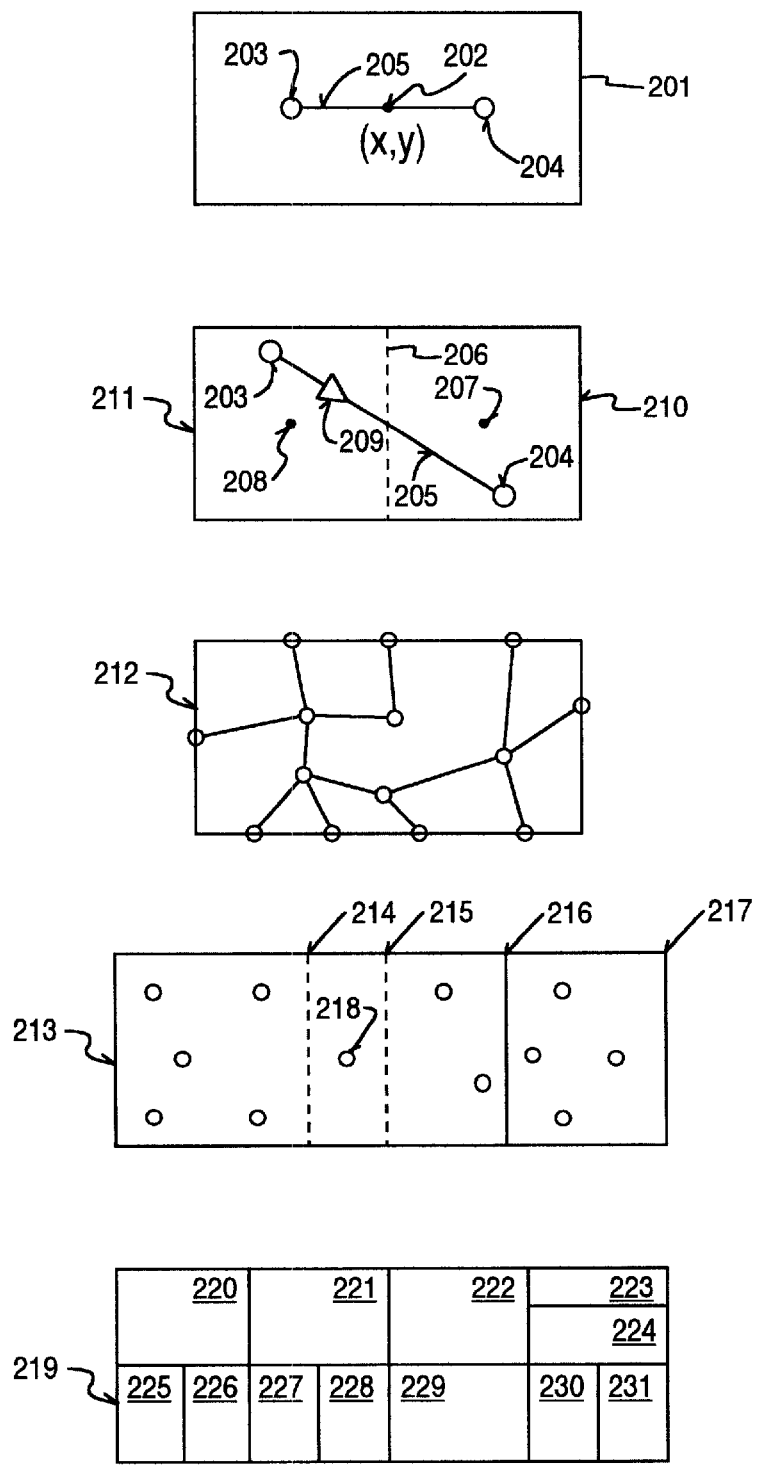
FIG. 2 shows a diagram illustrating an exemplary rough placement process whereby the netlist is allowed to change.

FIG. 2 shows a diagram illustrating an exemplary rough placement process whereby the netlist is allowed to change. Initially, at the first iteration, the total placement area is defined boundary 201 and consists of a single partition. Partition 201 is located according to its center point 202, which has a given (x,y) coordinate. In this example, two cells 202 and 203 are shown. Cell 202 can represent an AND gate while cell 203 can represent an XOR gate. A line 205 connects cell 202 to 203. For instance, the output from the XOR gate can be fed as an input to the AND gate. Next, the single partition 201 is divided into two partitions by drawing a vertical cutline 206 through the midpoint 202. A second iteration is then performed with respect to these two new partitions 210 and 211. Due to the partitioning, the synthesis process may choose to move the location of cells 203 and 204. Moreover, the size of the gates corresponding to cells 203 and 204 may be modified. For example, if the cells 203 and 204 were moved further apart, cell 203 may have its strength increased in order to properly drive the input to cell 204 (e.g., XOR gate with strength 1 changed to XOR gate with strength 2). If the line 205 becomes too long, a buffer 209 may be inserted to reduce the delay. Inserting a buffer 209 may allow the size of cell 203 to be scaled down.

After M iterations, the number of cells and nets might become quite complex. A representation of just a few cells is shown as 212. It can be seen that the area can become saturated rather quickly. Efficient partitioning can compensate for the increase in cell density. However, there might come a point where there is not enough room to add an additional cell. The present invention overcomes this limitation whereby, the total area is allowed to expand in order to accommodate additional nets and/or cells. An example of an expanded area is shown as 213. Expanding the total area affects the partitioning. For example, the location of vertical cutline 214 corresponding to the original area size is now moved to location 215 in order to account for the increase in size as the width of the original boundary 216 is increased by shifting the right boundary to location 217. A change in the partitioning might lead to different placements. For example, prior to enlarging the area, cell 218 belonged to the rightmost partition. After the enlargement, cell 218 now belongs to the leftmost partition. The synthesis tool is then supplied with this additional location information. Based on this new information, the synthesis tool can now generate an improved netlist. This new netlist contains the logic description of a circuit to which cells must be electrically connected, but has no geometry. The cells are partitioned first into two groups, then into four, then into eight, and so on, until there are only a few cells in each group. The first step of partitioning divides the n cells into two sets of n/2 cells. The number of cells in each side is approximately the same. The area of each half is proportional to the area of the cells included in it. The next step of partitioning is to divide each of these groups in two, this time on the other axis. This process continues until there are only a few cells in each group (e.g., twenty or less). For example, area 219 has been subdivided into twelve separate partitions 220–231. If each of these partitions 220–231 is small enough to meet a particular criteria set by the user, convergence is declared. For each partition, a group of cells and nets are defined. A detailed placement process is then initiated to actually physically place the gates and wires within each of the partitions 220–231. Thereupon a routing process is performed.

Figure 3:
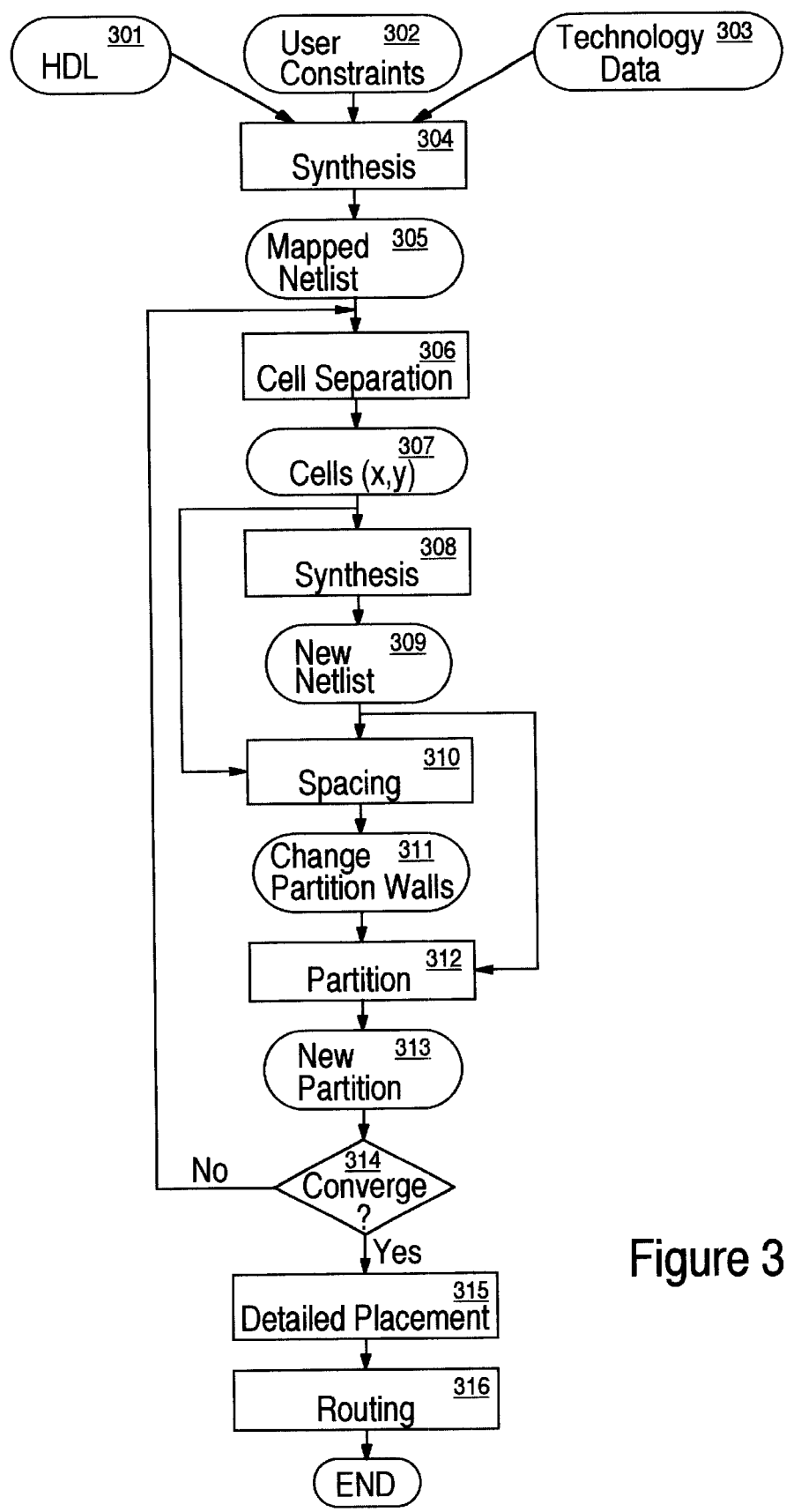
FIG. 3 is a detailed flow diagram describing the inputs, outputs and functions associated with each of the steps of the currently preferred embodiment of the present invention.

FIG. 3 is a detailed flow diagram describing the inputs, outputs and functions associated with each of the steps of the currently preferred embodiment of the present invention. The inputs and outputs are shown in ovals, whereas the process steps are shown in blocks. Initially, the synthesis tool of step 304 accepts as inputs hardware design language (HDL) 301, user constraints 302, and technology data 303. The HDL language format 301 includes special constructs and verification protocols used to develop, analyze, and document a hardware design. The user constraints 302 are constraints specified by the user relating to the chip's performance characteristics (e.g., timing, dock, frequency, power level, skew, delay, etc.). The technology data 303 pertains to the chip's physical attributes, such as a particular architecture (e.g., very large scale integration—VLSI), semiconductor process (e.g., 0.25 micron), specific gate shapes and dimensions which are stored in a library, etc. All of these inputs 301–303 are shaped and selected by the user to customize the chip design. A synthesis tool is then applied in step 304 to refine and generate a mapped netlist 305.

The mapped netlist is input to a cell separator. Cell separation is then performed in step 306 to assign (x,y) coordinates for each cell in the mapped netlist 305. As described above, the task of cell separation is to calculate the positions of the cells. Since the quality of the placement determines the minimal achievable area and wiring length of a circuit, placement has a large impact on production yield and circuit performance. Cell separation tools handle the problem of assigning locations to cells (e.g., objects or elements) so as to minimize some overall cost function. In this area, the cost function is related to the wiring distance between cells. Cells must be assigned locations so that they do not overlap each other, they all fit within some overall bounding figure, and the total wiring cost is minimized. The output from cell separation process 306 is a number of cells, each of which has an assigned (x,y) position 307 denoting the approximate centerpoint of the cell. A subroutine call is made back to the synthesis program with the new cell location information 307. Based on this new cell information, the synthesis program then generates a new netlist 309. The (x,y) location of the cells 307 and the new netlist 309 are input to a spacing tool. The spacing step 310 changes the partition walls in order to improve the spacings between the cells. The updated partition wall locations 311 are generated by spacing step 310. Next, the updated partition walls 311 and the new netlist 309 are used to formulate new partitions in step 312. There are a number of different partitioning approaches that can be implemented with the present invention. One such method is disclosed in the article by Ren-Song Tsay, Ernest S. Kuh, and Chi-Ping Hsu, PROUD: *A Fast Sea-Of-Gates Placement Algorithm,* published in the 25th ACM/IEEE Design Automation Conference (1988), paper 22.3. This approach takes advantage of inherent sparsity in the connectivity specification for an integrated circuit design and solves repeatedly sparse linear equations by the SOR (successive over-relaxation) method in a top-down hierarchy. Another approach is disclosed in a paper by Alfred E. Dunlop and Brian W. Kernighan, A *Procedure for Placement of Standard-Cell VLSI Circuits,* published in the IEEE Transactions on Computer-Aided Design, Vol. CAD-4, No. 1, January 1985. This approach is based on graph partitioning to identify groups of modules that ought to be close to each other, and uses a technique for properly accounting for external connections at each level of partitioning. Other approaches to the partitioning process include min-cut, force-directed, simulated annealing, and spectral approaches.

The resulting new partitions 313 are then examined in step 314 to determine whether convergence has been achieved. If convergence has not been achieved, steps 306–313 are repeated. It should be noted that in some cases, convergence is not possible. If convergence is not reached after some number of iterations, an error message is generated. Once convergence is attained, the rough placement process is complete. The user constraints 302, technology data 303, most recent netlist 309, and cell partition 313 information are input to the detailed placement process 315. Finally, a rough and detailed routing step 316 is executed.

Figure 4:
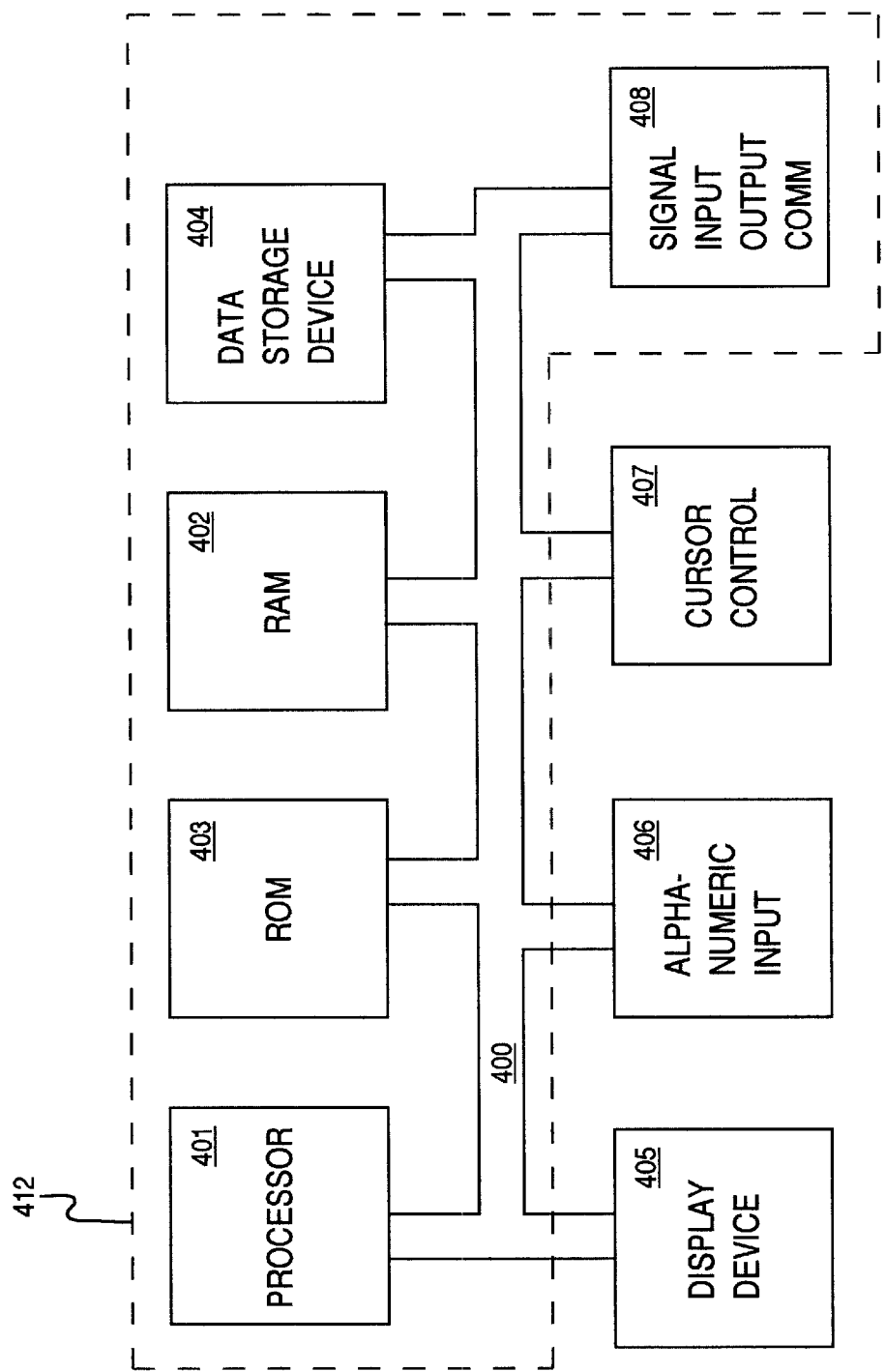
FIG. 4 illustrates a general purpose computer system upon which the present invention can be used to implement procedures, processes, logic blocks, etc., as described herein.

Referring to FIG. 4, an exemplary computer system 412 upon which the present invention may be practiced is shown. The rough placement procedures responsive to netlist changes are operable within computer system 412. When configured with the rough placement procedures of the present invention, system 412 becomes a computer aided design (CAD) tool 412, for integrated circuit placement. Rough placement procedures described in FIGS. 1 and 3 are implemented within system 412.

In general, computer systems 412 used by the preferred embodiment of the present invention comprise a bus 400 for communicating information, a central processor 401 coupled with the bus for processing information and instructions, a computer readable volatile memory 402 (e.g., random access memory) coupled with the bus 400 for storing information and instructions for the central processor 401. A computer readable read only memory 403 is also coupled with the bus 400 for storing static information and instructions for the processor 401. A data storage device 404 such as a magnetic or optical disk and disk drive coupled with the bus 400 is used for storing information and instructions. A display device 405 coupled to the bus 400 is used for displaying information to the computer user. And an alphanumeric input device 406 including alphanumeric and function keys is coupled to the bus 400 for communicating information and command selections to the central processor 401. A cursor control device 407 is coupled to the bus for communicating user input information and command selections to the central processor 101, and a signal generating device 408 is coupled to the bus 400 for communicating command selections to the processor 401.

The display device 405 of FIG. 4 utilized with the computer system 412 of the present invention may be a liquid crystal device, cathode ray tube, or other display device suitable for creating graphic images and alphanumeric characters recognizable to the user. The cursor control device 407 allows the computer user to dynamically signal the two dimensional movement of a visible symbol (pointer) on a display screen of the display device 405.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. In the design of integrated circuits, a computer controlled method for placing cells in a placement area, comprising:

generating a netlist through a synthesis process;

establishing a convergence criterion based upon a partition size;

executing a cell separation process according to the netlist:

changing the netlist in response to how the cells are placed;

modifying the spacings of the cells responsive to changes made to the netlist;

partitioning the cells into a plurality of partitions; and,
determining whether the partitions meet said criterion for convergence.

2. The method of claim 1, further comprising inputting HDL, user constraints, and technology data into the synthesis process for generating the netlist.

3. The method of claim 1 wherein a change to the netlist includes sizing a gate up or down.

4. The method of claim 1 wherein a change to the netlist includes adding or deleting one or more gates.

5. The method of claim 1 wherein the partition size is measured by the number of gates contained therein.

6. In the design of integrated circuits, a computer controlled method for placing cells in a placement area, comprising:

generating a netlist through a synthesis process;

establishing a convergence criterion based upon a partition size;

executing a cell separation process according to the netlist;

changing the netlist;

changing the size of said placement area;

modifying the spacings of the cells responsive to changes made to the netlist;

partitioning the cells into a plurality of partitions; and, determining whether the partitions meet said criterion for convergence.

7. The method of claim 6, further comprising inputting HDL, user constraints, and technology data into the synthesis process for generating the netlist.

8. The method of claim 6 wherein a change to the netlist includes sizing a gate up or down.

9. The method of claim 6 wherein a change to the netlist includes adding or deleting one or more gates.

10. The method of claim 6 wherein the partition size is measured by the number of gates contained.

11. In the design of integrated circuits, a computer controlled method for placing cells in a placement area, comprising:

generating a netlist through a synthesis process;

establishing a convergence criterion based upon a partition size;

executing a cell separation process according to the netlist:

changing the netlist in response how the cells are placed;

changing the size of said placement area;

modifying the spacings of the cells responsive to changes made to the netlist;

partitioning the cells into a plurality of partitions; and, determining whether the partitions meet said criterion for convergence.

12. The method of claim 11, further comprising inputting HDL, user constraints, and technology data into the synthesis process for generating the netlist.

13. The method of claim 11 wherein a change to the netlist includes sizing a gate up or down.

14. The method of claim 11 wherein a change to the netlist includes adding or deleting one or more gates.

15. The method of claim 11 wherein the partition size is measured by the number of gates contained.

* * * * *

(12) EX PARTE REEXAMINATION CERTIFICATE (6057th)
United States Patent
Shenoy et al.

(10) Number: US 6,378,114 C1
(45) Certificate Issued: *Dec. 18, 2007

(54) METHOD FOR THE PHYSICAL PLACEMENT OF AN INTEGRATED CIRCUIT ADAPTIVE TO NETLIST CHANGES

(75) Inventors: Narendra V. Shenoy, Sunnyvale, CA (US); Lukas Van Ginneken, San Jose, CA (US)

(73) Assignee: Synopsys, Inc., Mountain View, CA (US)

( * ) Notice: This patent issued on a continued prosecution application filed under 37 CFR 1.53(d), and is subject to the twenty year patent term provisions of 35 U.S.C. 154(a)(2).

Reexamination Request:
No. 90/007,660, Aug. 9, 2005
No. 90/008,396, Dec. 26, 2006

Reexamination Certificate for:
Patent No.: 6,378,114
Issued: Apr. 23, 2002
Appl. No.: 08/886,625
Filed: Jul. 1, 1997

(51) Int. Cl.
*G06F 17/50* (2006.01)

(52) U.S. Cl. .............................................. 716/7; 716/8
(58) Field of Classification Search .................. 716/7, 716/8
See application file for complete search history.

(56) References Cited

U.S. PATENT DOCUMENTS

| | | |
|---|---|---|
| 5,757,657 A | 5/1998 | Hathaway et al. |
| 5,953,236 A | 9/1999 | Hossain et al. |

OTHER PUBLICATIONS

"An Integrated Approach to Logic Synthesis and Physical Design," a dissertation by Massoud Pedram for Ph.D. at the University of California at Berkeley, Aug. 1991, Technical Report UCB/Erl M91/69, pp. 1–159.

"The Future of Logic Synthesis and Physical Design in Deep–Submicron Process Geometries," by Keutzer et al., Proceedings of the 1997 International Symposium on Physical Design, Apr. 14–16, 1997, pp. 218–224.

"A Procedure for Placement of Standard–Cell VLSI Circuits," by Dunlop et al., *IEEE Transactions on Computer–Aided Design*, vol. CAD–4, No. 1, Jan. 1985, pp. 92–98.

"A New Circuit Optimization Technique for High Performance CMOS Circuits," by Chen et al, *IEEE Transactions on Computer Aided Design*, vol. 10, No. 5, May 1991, pp. 670, 677.

"Layout Driven Technology Mapping," by Pedram et al., $28^{th}$ ACM/IEEE Design Automation Conference, 1991, pp. 99–105.

"Modifying the Netlist After Placement for Performance Improvement," Ginetti et al., *IEEE Custom Integrated Circuits Conference*, 1993, pp. 9.2.1–9.2.4.

"VLSI Placement and Routing: The PI Project," by Alan T. Sherman, Springer–Verlag 1989, pp. 1–189.

(Continued)

*Primary Examiner*—Ovidio Escalante

(57) ABSTRACT

In the design of integrated circuits, a computer controlled method for the rough placement of cells. Initially, a synthesis tool is used to generate a netlist according to HDL, user constraint, and technology data. Thereupon, a cell separation process assigns (x,y) locations to each of the cells. The cell location information is supplied to the synthesis tool, which can then make changes to the netlist thereto. In the present invention, the size of the placement area is allowed be scaled according to the new netlist. Next, the cells are spaced apart according to a spacing algorithm. A partitioning algorithm is then applied to group the cells into a plurality of partitions. A number of iterations of cell separation, synthesis of new netlist, size adjustment (if necessary), spacing, and partitioning are performed until the cells converge. Thereupon, detailed placement and routing processes are used to complete the layout.

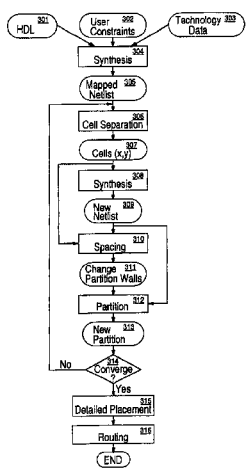

OTHER PUBLICATIONS

U.S. Office Action dated Aug. 3, 2006 that issued in Control U.S. Appl. No. 90/007,660 by Examiner Craver, pp. 1–19.

U.S. District Court for the Northern District of California, *Synopsys, Inc.* v. *Magma Design Automation, Inc.;* Amended Order Re: Claim Construction of U.S. Patent Nos. 6,453,446, 6,725,438 and 6,378,114.

Tsay, R. S., et al. "PROUD: A Sea–Of–Gates Placement Algorithm" Design & Test of Computers, 5:6 pp. 44–56, 1988.

Dunlop, A.E. and Kernighan, B. W., "A Procedure for Placement of Standard–Cell VLSI Circuits", IEEE Transactions on Computer–Aided Design of Integrated Circuits and Systems, 4:1 pp. 92–98, 1985.

Abouzeid, P., et al., "Multilevel Synthesis Minimizing the Routing Factor", Proceedings of the Design Automation Conference, pp. 365–368, 1990.

Alpert, C. J., et al., "Multilevel Circuit Partitioning", Proceedings of the Design Automation Conference, pp. 530–533, 1997.

Alpert, C. J. and Kahng, A. B., "Recent Directions in Netlist Partitioning: A Survey", Integration, the VLSI Journal, 1995.

Berman, C. L., et al., "The Fanout Problem: From Theory to Practice", Advanced Research in VLSI: Proceedings of the 1989 Decennial Caltech Conference, pp. 69–99, 1989.

Breuer, M. A., "Min–cut Placement", J. Design Automation and Fault Tolerant Computing, 1977.

Burstein, M. and Hong, S. J., "Hierarchical VLSI Layout", VLSI Design of Digital Systems, Proceedings of the IFIP/TC10/WG 10.5 International Conference, 1983.

Burstein, M. and Youssef, M. N., "Timing Influenced Layout Design", Proceedings of the Design Automation Conference, pp. 124–130, 1985.

Caldwell, A. B., et al., "On Wirelength Estimations for Row–Based Placement", IEEE Transactions on Computer–Aided Design of Integrated Circuits and Systems, 18:9 pp. 1265–178, 1998.

Cheng, C. K. and Kuh, E., "Module Placement Based on Resistive Network Optimization", IEEE Transactions on Computer–Aided Design, 1981.

Coudert, O., et al., "New Algorithms for Gate Sizing: A Comparative Study", Proceedings of the Design Automation Conference, pp. 734–739. ACM/IEEE, 1996.

Devadas, S., et al., Logic Synthesis, McGraw–Hill, 1994.

Donath, W. E., et al., "Timing Driven Placement Using Complete Path Delays", Proceedings of the Design Automation Conference, pp. 84–89, 1990.

Fiduccia, C. M. and Mattheyses, R.M., "A Linear Time Heuristic for Improving Network Partitions", Proceedings of the Design Automation Conference, pp. 175–181, 1982.

Hall, K., "An r–Dimensional Quadratic Placement Algorithm" Management Science, 17:3 pp. 219–229, 1970.

Hauge, P. S., et al., "Circuit Placement for Predictable Performance", Digest of Technical Papers, IEEE International Conference on Computer–Aided Design, pp. 88–91, 1987.

Hitchcock, R. B., "Timing Verification and the Timing Analysis Program", 19th Design Automation Conference, IEEE, pp. 594–604, 1982.

Hitchcock, R. B., et al., "Timing Analysis of Computer Hardware", Technical Report, IBM, pp. 100–105, 1982.

Hojat, S. and Villarubia, P., "An Integrated Placement and Synthesis Approach for Timing Closure of PowerPC Microprocessor", Proceedings of the International Conference on Computer Design, pp. 206–210, 1997.

Hu, T. C. and Kuh, E. S., editors, VLSI Circuit Layout: Theory and Design, IEEE Press, 1985.

Ishioka, T., et al. "Layout Driven Delay Optimization with Logic Re–synthesis", Proceedings of the International Workshop on Logic Synthesis, 1997.

Jackson, M. A. B., et al., "A Fast Algorithm for Performance–Driven Placement", Digest of the International Conference on Computer–Aided Design, pp. 328–331, 1990.

Kannan, L. N., et al., "A Methodology and Algorithms for Post–Placement Delay Optimization", Proceedings of the Design Automation Conference, pp. 327–332 1994.

Kernighan, B. and Lin, S., "An efficient Heuristic Procedure for Partitioning Graphs", Bell Sys. Tech. J., pp. 291–308, 1970.

Keutzer, K., "DAGON: Technology Binding and Local Optimization by DAG Matching", Proceedings fo the Design Automation Conference, pp. 341–347, ACM/IEEE, 1987.

Keutzer, K, et al., "The Future of Logic Synthesis and Physical Design in Dee–Submicron Process Geometries", International Symposium on Physical Design, pp. 218–224, 1997.

Kirkpatrick, S., et al., "Optimization by Simulated Annealing", Science, 220:4598 pp. 671–680, 1983.

Kleinhans, J. M.,, et al., "GORDIAN: VLSI Placement by Quadratic Programming and Slicing Optimization", IEEE Transactions on Computer–Aided Design, 10:3 pp. 356–365, 1991.

Kodandapani, K., et al., "A Simple Algorithm for Fanout Optimization Using High–Performance Buffer Libraries", Digest of the International Conference on Computer–Aided Design, pp. 466–471, IEEE, 1993.

Lauther, U., "A Min–Cut Placement Algorithm for General Cell Assemblies Based on a Graph Representation", Proceedings of the Design Automation Conference, pp. 1–10, 1979.

Lengauer, T., Combinatorial Algorithms for Integrated Circuit Layout, Teubner–Wiley, 1990.

Otten, R., Design Systems for VLSI Circuits, Chapter Layout Compilation, Martinus Nijhoff, 1987.

Pedram, M. and Bhat, N. "Layout Driven Logic Restructuring/Decomposition", Proceedings of the Design Automation Conference, pp. 134–137, 1991.

Pedram, M. and Bhat, N., "Layout Driven Technology Mapping", Proceedings of the Design Automation Conference, pp. 99–105, 1991.

Romeo F. and Sangiovanni–Vincentelli, A., "Convergence and Finite Time Behavior of Simulated Annealing" Proceedings of the 24th Conference on Decision and Control, pp. 761–767, 1985.

Vygen, J., "Algorithms for Large–Scale Flat Placement", Proceedings of the Design Automation Conference, pp. 746–751, 1997.

Sechen, C., "Chip–Planning, Placement and Global Routing of Macro/Custom Cell Integrated Circuits Using Simulated Annealing", Proceedings of the Design Automation Conference, pp. 73–80, 1988.

Sherwani, N., Algorithms for VLSI Physical Design Automation, Kluwer Academic Publishers, 1995.

Stenz, G., et al., "Timing Driven Placement in Interaction with Netlist Transformations" International Symposium on Physical Design, pp. 36–41, 1997.

Stockmeyer, L., "Optimal Orientations of Cells in Slicing Floor–Plan Design", Information and Control, 57: 2–3 pp. 91–101, 1983.

Tsay, R. S. and Koehl, J., "An Analytic Net Weighting Approach for Performance Optimization in Circuit Placement", Proceedings of the Design Automation Conference, pp. 620–625, 1991.

Vaishnav, H. and Pedram, M., "Routability–Driven Fanout Optimization" Proceedings of the Design Automation Conference, pp. 230–235, 1993.

Rudell, R., Logic Synthesis for VLSI Design, Ph.D. Thesis, University of California, Berkeley, 1989.

"A Methodology and Algorithms for Post–Placement Delay Optimization," by Kannen et al, The $31^{st}$ ACM/IEEE–CAS/EDAC Design Automation Conference, Jun. 6–10, 1994, San Diego, CA.

"A Procedure for Placement of Standard–Cell VLSI Circuits," by Dunlop et al., IEEE Transactions on Computer–Aided Design, vol. CAD–4, No. 1, Jan. 1985.

"A New Circuit Optimization Technique for High Performance CMOS Circuits," by Chen et al., IEEE Transactions on Computer Aided Design, vol. 10, No. 5, 1991.

"An Integrated Placement and Synthesis Approach for Timing Closure of PowerPC™ Microprocessors," by Hojat et al., International Workshop on Logic & Synthesis (IWLS), May 18–21, 1997, Tahoe City, CA.

"Circuit placement, chip optimization, and wire routing for IBM IC technology," by Hathaway et al., IBM Journal of Research and Development, vol. 40, No. 4, Jul. 1996.

"Timing Driven Placement in Interaction with Netlist Transformations," Stenz et al., Proceedings of the 1997 International Symposium on Physical Design (ISPD '97), Napa Valley California, Apr. 1997.

"Layout Driven Technology Mapping," Pedram et al., Design Automation Conference, 1991.

"Modifying the Netlist After Placement for Performance Improvement," by Ginetti and Brasen, IEEE 1993 Custom Integrated Circuits Conference, pp. 9.2.1–9.2.4.

"Concurrent Logic and Layout Design System for High Performance LSIs," by Murakata et al., IEEE 1995 Custom Integrated Circuits Conference, pp. 23.3.1–23.3.4.

"VLSI Placement and Routing: The PI Project," by Alan T. Sherman, Springer–Verlag1989, pp. 1–189.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 6 and 11 are cancelled.

Claims 2-5, 7-10 and 12-15 are determined to be patentable as amended.

New claims 16-18 are added and determined to be patentable.

2. The method of claim [1] *16*, further comprising inputting HDL, user constraints, and technology data into the synthesis process for generating the netlist.

3. The method of claim [1] *16* wherein a change to the netlist includes sizing a gate up or down.

4. The method of claim [1] *16* wherein a change to the netlist includes adding or deleting one or more gates.

5. The method of claim [1] *16* wherein the partition size is measured by the number of gates contained therein.

7. The method of claim [6] *17*, further comprising inputting HDL, user constraints, and technology data into the synthesis process for generating the netlist.

8. The method of claim [6] *17* wherein a change to the netlist includes sizing a gate up or down.

9. The method of claim [6] *17* wherein a change to the netlist includes adding or deleting one or more gates.

10. The method of claim [6] *17* wherein the partition size is measured by the number of gates contained.

12. The method of claim [11] *18*, further comprising inputting HDL, user constraints, and technology data into the synthesis process for generating the netlist.

13. The method of claim [11] *18* wherein a change to the netlist includes sizing a gate up or down.

14. The method of claim [11] *18* wherein a change to the netlist includes adding or deleting one or more gates.

15. The method of claim [11] *18* wherein the partition size is measured by the number of gates contained.

*16. In the design of integrated circuits, a computer controlled method for placing cells in a placement area, comprising:*

*Generating a netlist through a synthesis process identifying cells to be placed in the placement area;*

*establishing a convergence criterion based upon a partition size; and*

*performing an iterative process to achieve the convergence criterion, wherein at least one iteration in the iterative process operates on one or more current partitions and wherein partitions associate respective groups of cells with regions in the placement area, the at least one partition including:*

*executing a cell separation process according to the netlist to place cells in the netlist within the regions of the partitions with which the cells are associated;*

*changing the netlist in response to how the cells are placed in the cell separation process;*

*modifying the spacings of the cells including modifying the region associated with at least one partition, responsive to changes made to the netlist;*

*further partitioning the cells after said modifying the region to provide one or more additional partitions; and*

*determining whether the partitions meet said criterion for convergence.*

*17. In the design of integrated circuits, a computer controlled method for placing cells in a placement area, comprising:*

*Generating a netlist through a synthesis process identifying cells to be placed in the placement area;*

*establishing a convergence criterion based upon a partition size; and*

*performing an iterative process to achieve the convergence criterion, wherein at least one iteration in the iterative process operates on one or more current partitions and wherein partitions associate respective groups of cells with regions in the placement area, the at least one iteration including:*

*executing a cell separation process according to the netlist to place cells in the netlist within the regions of the partitions with which the cells are associated;*

*changing the netlist;*

*changing the size of said placement area;*

*modifying the spacings of the cells including modifying the region associated with at least one partition, responsive to changes made to the netlist;*

*further partitioning the cells after said modifying the region to provide one or more additional partitions; and*

*determining whether the partitions meet said criterion for convergence.*

*18. In the design of integrated circuits, a computer controlled method for placing cells in a placement area, comprising:*

*generating a netlist through a synthesis process identifying cells to be placed in the placement area;*

*establishing a convergence criterion based upon a partition size; and*

*performing an iterative process to achieve the convergence criterion, wherein at least one iteration in the iterative process operates on one or more current partitions and wherein partitions associate respective groups of cells with regions in the placement area, the at least one iteration including:*

*executing a cell separation process according to the netlist to place cells in the netlist within the regions of the partitions with which the cells are associated;* changing the netlist in response to how the cells are placed in the cell separation process;

changing the size of said placement area;

modifying the spacings of the cells including modifying the region associated with at least one partition, responsive to changes made to the netlist;

further partitioning the cells after said modifying the region to provide one or more additional partitions; and determining whether the partitions meet said criterion for convergence.

* * * * *